United States Patent
Dai et al.

(10) Patent No.: US 11,000,956 B2
(45) Date of Patent: May 11, 2021

(54) GRIPPING SYSTEM

(71) Applicants: Tyco Electronics (Shanghai) Co. Ltd., Shanghai (CN); Shenzhen AMI Technology Co. Ltd., Shenzhen (CN)

(72) Inventors: Zhiyong Dai, Shanghai (CN); Lvhai Hu, Shanghai (CN); Yun Liu, Shanghai (CN); Qinglong Zeng, Shanghai (CN); Wei Kang, Shanghai (CN)

(73) Assignees: Tyco Electronics (Shanghai) Co. Ltd., Shanghai (CN); Shenzhen AMI Technology Co. Ltd., Shenzhen (CN)

( * ) Notice: Subject to any disclaimer, the term of this patent is extended or adjusted under 35 U.S.C. 154(b) by 0 days.

(21) Appl. No.: 16/553,817

(22) Filed: Aug. 28, 2019

(65) Prior Publication Data
US 2019/0381675 A1 Dec. 19, 2019

Related U.S. Application Data

(63) Continuation of application No. PCT/IB2018/051192, filed on Feb. 26, 2018.

(30) Foreign Application Priority Data

Feb. 28, 2017 (CN) .......................... 201710112539.X

(51) Int. Cl.
*B25J 15/00* (2006.01)
*B25J 15/02* (2006.01)
*B65G 47/26* (2006.01)

(52) U.S. Cl.
CPC ....... *B25J 15/0061* (2013.01); *B25J 15/0226* (2013.01); *B65G 47/26* (2013.01)

(58) Field of Classification Search
CPC ............... B25J 15/0052; B25J 15/0061; B25J 15/0226; B65G 47/082; B65G 47/26; B65G 47/28; B65G 47/901; B65G 47/907
(Continued)

(56) References Cited

U.S. PATENT DOCUMENTS 3,495,722 A * 2/1970 Schroder ................ A21C 15/00
198/468.3
3,630,391 A * 12/1971 Wilson ................... B21D 43/10
414/744.8
(Continued)

FOREIGN PATENT DOCUMENTS

DE     102012219127 B3    1/2014
GB         2085400 A      4/1982
(Continued)

OTHER PUBLICATIONS

PCT Notification, International Search Report and Written Opinion of the International Searching Authority, International Application No. PCT/IB2018/051192, dated Jun. 8, 2018, 15 pages.
(Continued)

*Primary Examiner* — Dean J Kramer
(74) *Attorney, Agent, or Firm* — Barley Snyder

(57) ABSTRACT

A gripping system includes a gripping device and a pitch adjustment device. The gripping device has a row of grippers arranged in a first direction and adapted to grip a row of contacts and a support frame on which at least two adjacent grippers of the row of grippers are slidably attached. The pitch adjustment device is adapted to drive the at least two adjacent grippers to slide in the first direction to adjust a pitch between the two adjacent grippers.

18 Claims, 4 Drawing Sheets

(58) Field of Classification Search
USPC ....... 294/87.1; 414/753.1, 416.02; 198/468.3
See application file for complete search history.

(56) References Cited

U.S. PATENT DOCUMENTS

| | | | |
|---|---|---|---|
| 4,958,982 A * | 9/1990 | Champet | H01L 21/67781 |
| | | | 294/87.1 |
| 5,102,287 A | 4/1992 | Johnson et al. | |
| 5,481,794 A | 1/1996 | Fischer et al. | |
| 6,217,093 B1 | 4/2001 | Neutel et al. | |
| 8,141,922 B2 * | 3/2012 | Shim | H01L 21/6838 |
| | | | 294/87.1 |
| 9,227,795 B2 * | 1/2016 | Yin | B65G 33/02 |
| 2014/0112744 A1 | 4/2014 | Bauch et al. | |
| 2015/0001867 A1 | 1/2015 | Zhu | |

FOREIGN PATENT DOCUMENTS

| | | |
|---|---|---|
| JP | S561577781 U | 11/1981 |
| KR | 101307954 B1 | 9/2013 |

OTHER PUBLICATIONS

Abstract of KR101307954, dated Sep. 12, 2013, 1 page.
PCT International Preliminary Report on Patentability, International Application No. PCT/IB2018/051192, dated Sep. 3, 2019, 8 pages.

* cited by examiner

GRIPPING SYSTEM

CROSS-REFERENCE TO RELATED APPLICATIONS

This application is a continuation of PCT International Application No. PCT/IB2018/051192, filed on Feb. 26, 2018, which claims priority under 35 U.S.C. § 119 to Chinese Patent Application No. 201710112539.X, filed on Feb. 28, 2017.

FIELD OF THE INVENTION

The present invention relates to a gripping system and, more particularly, to a gripping system adapted to grip a row of contacts.

BACKGROUND

A gripping system for gripping a row of contacts commonly includes a single gripper. The row of contacts are all gripped by the gripper. The gripper has a constant gripping pitch; the pitch between adjacent contacts of the row of contacts may not be adjusted once the row of contacts is clamped to a single gripper. Therefore, when the pitch between adjacent contacts needs to be changed, it is necessary to change grippers with different gripping pitches, which complicates the gripping operation.

SUMMARY

A gripping system includes a gripping device and a pitch adjustment device. The gripping device has a row of grippers arranged in a first direction and adapted to grip a row of contacts and a support frame on which at least two adjacent grippers of the row of grippers are slidably attached. The pitch adjustment device is adapted to drive the at least two adjacent grippers to slide in the first direction to adjust a pitch between the two adjacent grippers.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
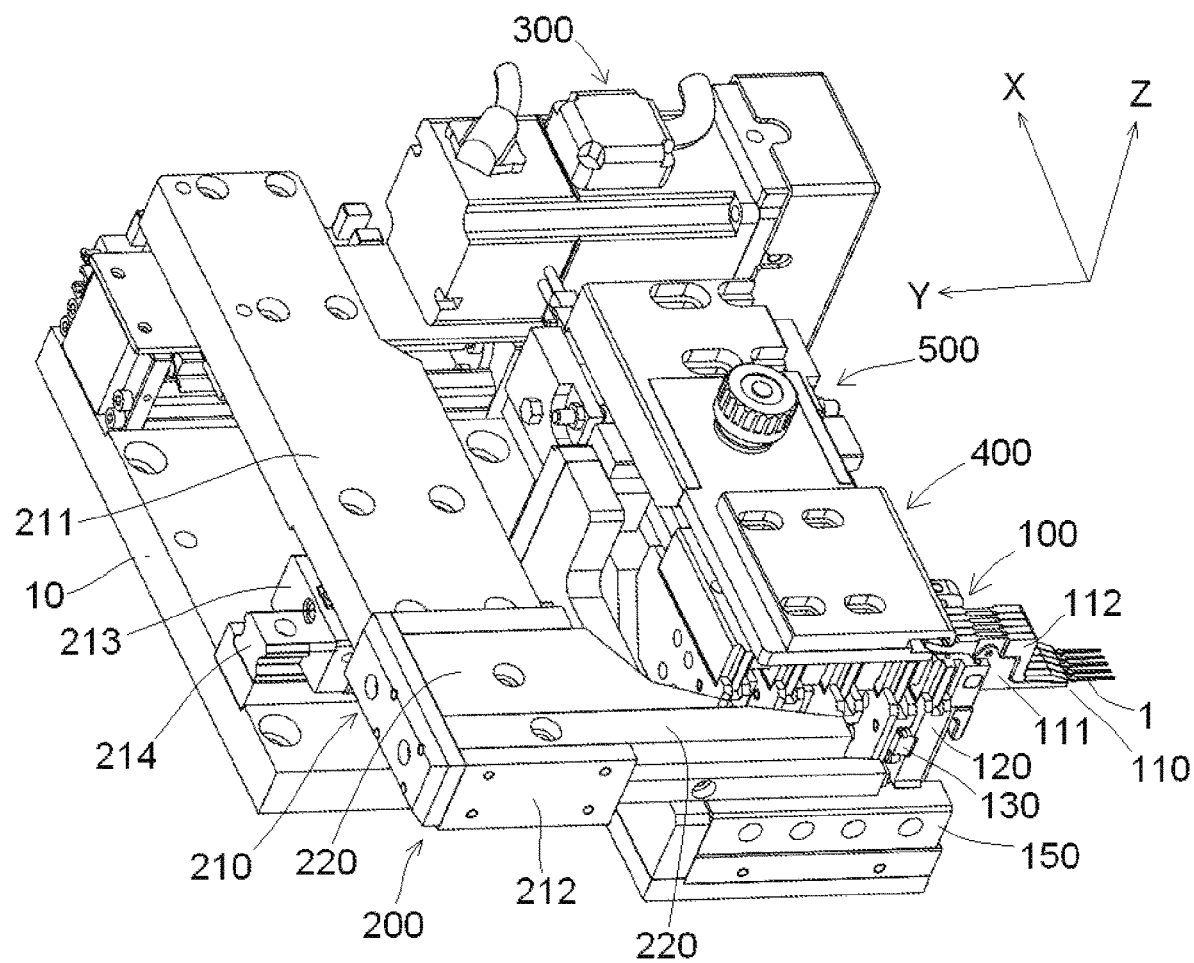
FIG. 1 is a perspective view of a gripping system according to an embodiment.

Exemplary embodiments of the present disclosure will be described hereinafter in detail with reference to the attached drawings, wherein like reference numerals refer to like elements. It should be understood that the description of the embodiments in conjunction with the attached drawings is to convey a general concept of the present disclosure to the person of ordinary skill in the art, and is not intended to limit the present disclosure to the described exemplary embodiments.

Furthermore, in the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A gripping system according to an embodiment, as shown in FIG. 1, comprises a gripping device 100 and a pitch adjustment device 200, 300. The gripping device 100 includes a row of grippers 110 arranged in a first direction X and adapted to grip a row of contacts 1. The pitch adjustment device 200, 300 is adapted to adjust a pitch between two adjacent grippers 110 of the row of grippers 110, such that the pitch between the adjacent contacts 1 of the row of contacts 1 gripped on the row of the grippers 110 may be adjusted.

Figure 2:
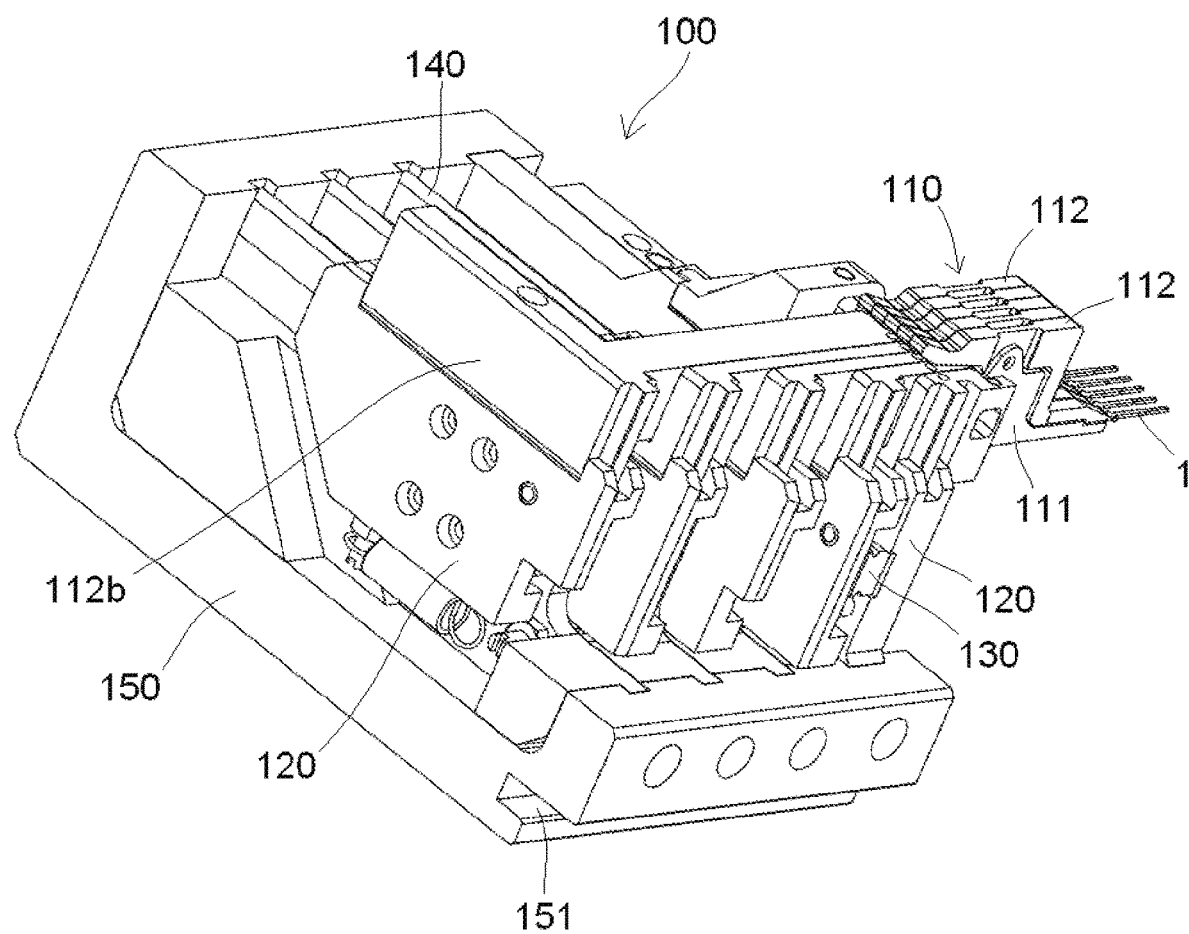
FIG. 2 is a perspective view of a gripping device of the gripping system.
Figure 3:
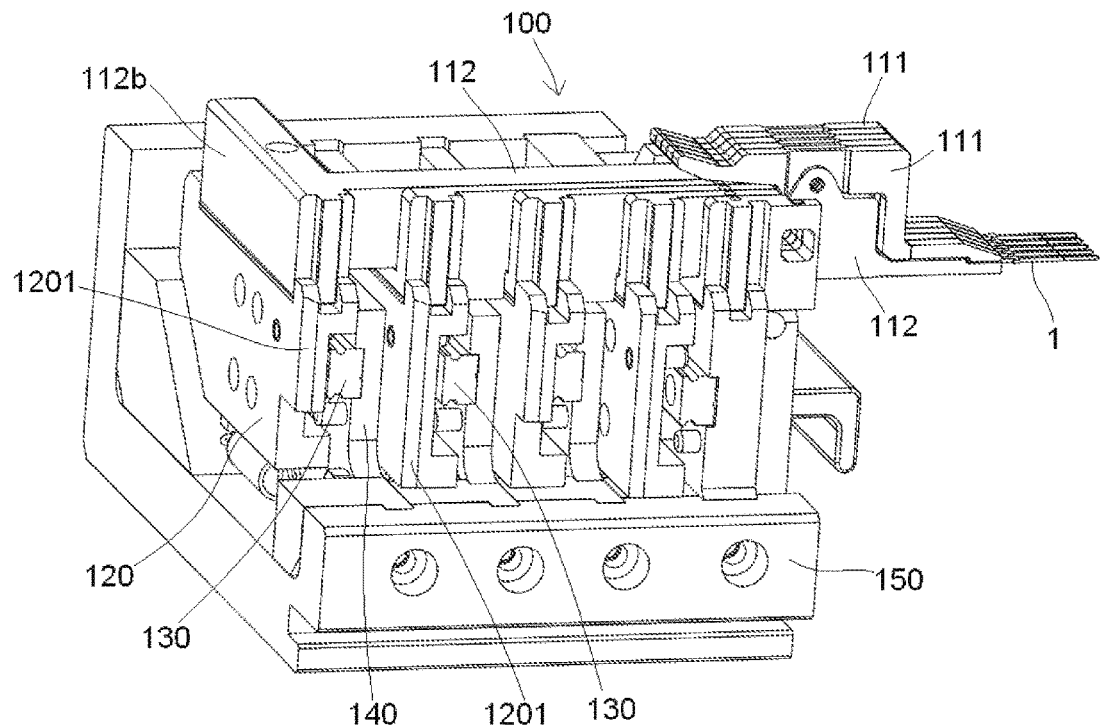
FIG. 3 is a perspective view of the gripping device.

The gripping device 100, as shown in FIGS. 1-3, includes a support frame 150. Each gripper 110 of the row of grippers 110 other than an outmost gripper 110 is slidably attached on the support frame 150. The outmost gripper 110 of the row of grippers 110 is fixedly attached on the support frame 150 and may not be moved. The pitch adjustment device 200, 300 is adapted to drive each gripper 110 of the row of grippers 110 other than the outmost gripper 110 to slide in the first direction X, so as to adjust the pitch between the adjacent grippers 110 of the row of grippers 110.

The gripping device 100, as shown in FIGS. 1-3, includes a row of gripper supports 120. The row of gripper supports 120 are arranged in a second direction Y perpendicular to the first direction X, and the row of grippers 110 are respectively attached on the row of gripper supports 120. As shown in FIGS. 2 and 3, each gripper support 120 of the row of gripper supports 120 other than an outmost gripper support 120 is slidably attached on the support frame 150.

The gripping device 100, as shown in FIGS. 1-3, includes a row of sliding rails 130, which are attached on the support frame 150. Each gripper support 120 of the row of gripper supports 120 other than the outmost gripper support 120 is slidably attached on a corresponding one of the row of sliding rails 130. The outmost gripper support 120, for example the rightmost gripper support 120 in FIG. 2, of the row of gripper supports 120 is fixedly attached on the support frame 150 and may not be moved.

The gripping device 100, as shown in FIGS. 2 and 3, includes a row of mounting plates 140. The row of mounting plates 140 are attached on the support frame 150. The row of sliding rails 130 are respectively attached on the row of mounting plates 140.

The gripping system, as shown in FIG. 1, comprises a base 10, on which the entire gripping device 100 is removably attached. As shown in the embodiment of FIGS. 1 and 2, a groove 151 is formed on the support frame 150, and a projection (not shown) fitted to the groove 151 is formed on the base 10.

Figure 4:
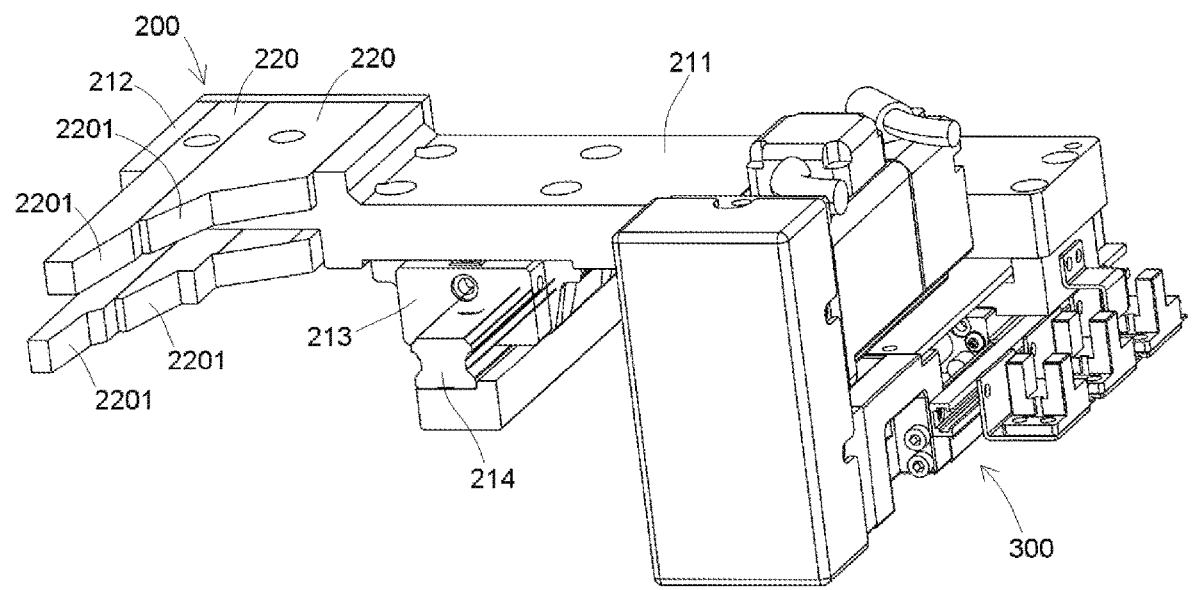
FIG. 4 is a perspective view of a pitch adjustment device of the gripping system.

The pitch adjustment device 200, 300, as shown in FIGS. 1 and 4, includes a first pushing mechanism 200 and a first drive mechanism 300. The first pushing mechanism 200 is slidably attached on the base 10 and adapted to push each gripper support 120 of the row of gripper supports 120 other than the outmost gripper support 120 to slide in the first direction X. The first drive mechanism 300 is attached on the base 10 and adapted to drive the first pushing mechanism 200 to slide in the second direction Y.

The first pushing mechanism 200, as shown in FIGS. 1 and 4, includes a bracket 210 and a plurality of drive blocks 220. The bracket 210 is slidably attached on the base 10. The plurality of drive blocks 220 are attached on the bracket 210. The first drive mechanism 300 is adapted to drive the bracket 210 to slide in the second direction Y so as to drive the plurality of drive blocks 220 attached on the bracket 210 to move in the second direction Y.

As shown in FIGS. 3 and 4, a plurality of first tilting surfaces 2201 is formed on each drive block 220, and a second tilting surface 1201 cooperated with the first tilting surface 2201 is formed on a corresponding gripper support 120. The first tilting surface 2201 of each drive block 220 is adapted to push against the second tilting surface 1201 of the corresponding gripper support 120 and slide relative to the second tilting surface 1201, so that the corresponding gripper support 120 is driven to move in the second direction Y.

The bracket 210, as shown in FIGS. 1 and 4, includes a beam 211 and a frame 212. The beam 211 is slidably attached on the base 10. The frame 212 is attached on the beam 211. The plurality of drive blocks 220 are removably attached on the frame 212.

The first pushing mechanism 200, as shown in FIGS. 1 and 4, includes a slider 213 and a guiding rail 214. The beam 211 is attached on the slider 213. The guiding rail 214 is attached on the base 10. The slider 213 is slidably attached on the guiding rail 214 such that the bracket 210 is slidable along the guiding rail 214 in the second direction Y.

As shown in FIGS. 1 and 4, in various embodiments, the first drive mechanism 300 is a cylinder drive mechanism, a stepping motor drive mechanism, or a servo motor drive mechanism.

Figure 5:
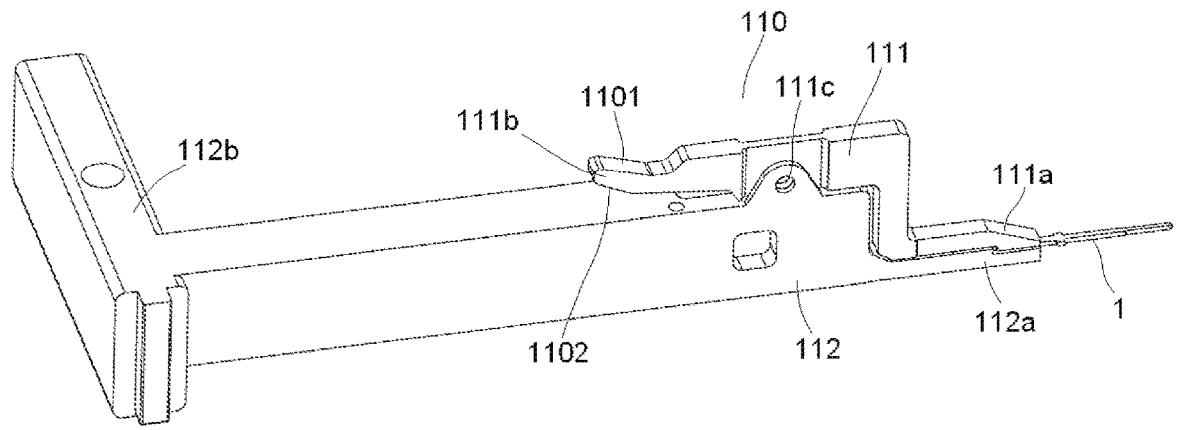
FIG. 5 is a perspective view of a gripper of the gripping device.

Each gripper 110, as shown in FIGS. 1, 3, and 5, includes a lower gripping portion 112 and an upper gripping portion 111 pivotally attached on the lower gripping portion 112 such that the upper gripping portion 111 may rotate about a pivoting axis 111c. The lower gripping portion 112 is fixedly attached on a corresponding gripper support 120. As shown in FIGS. 3 and 5, a rear end 112b of the lower gripping portion 112 is removably attached on the corresponding gripper support 120, so that the each gripper 110 may be moved in the first direction X together with the corresponding gripper support 120.

When the bracket 210 is driven to slide in the second direction Y by the first drive mechanism 300, the plurality of first tilting surfaces 2201 of each drive block 220 push against the second tilting surface 1201 of the corresponding gripper support 120 sequentially from left to right in FIG. 1 and slide relative to the second tilting surface 1201. In this way, the corresponding gripper support 120 is driven to move in the first direction X. Since different first tilting surfaces 2201 having different heights in the first direction X are in contact with the second tilting surfaces 1201 of different gripper supports 120, respectively, during the sliding of the bracket 210 in the second direction Y, the grippers 110 are driven to move in the first direction X by different distances. Accordingly, the contacts 1 held on the grippers move in the first direction X by the different distances, so that the pitch between two adjacent contacts 1 of the row of contacts 1 is set. By replacing the drive blocks 220 having different first tilting surfaces 2201, the pitch between two adjacent contacts 1 of the row of contacts 1 can be adjusted.

Figure 6:
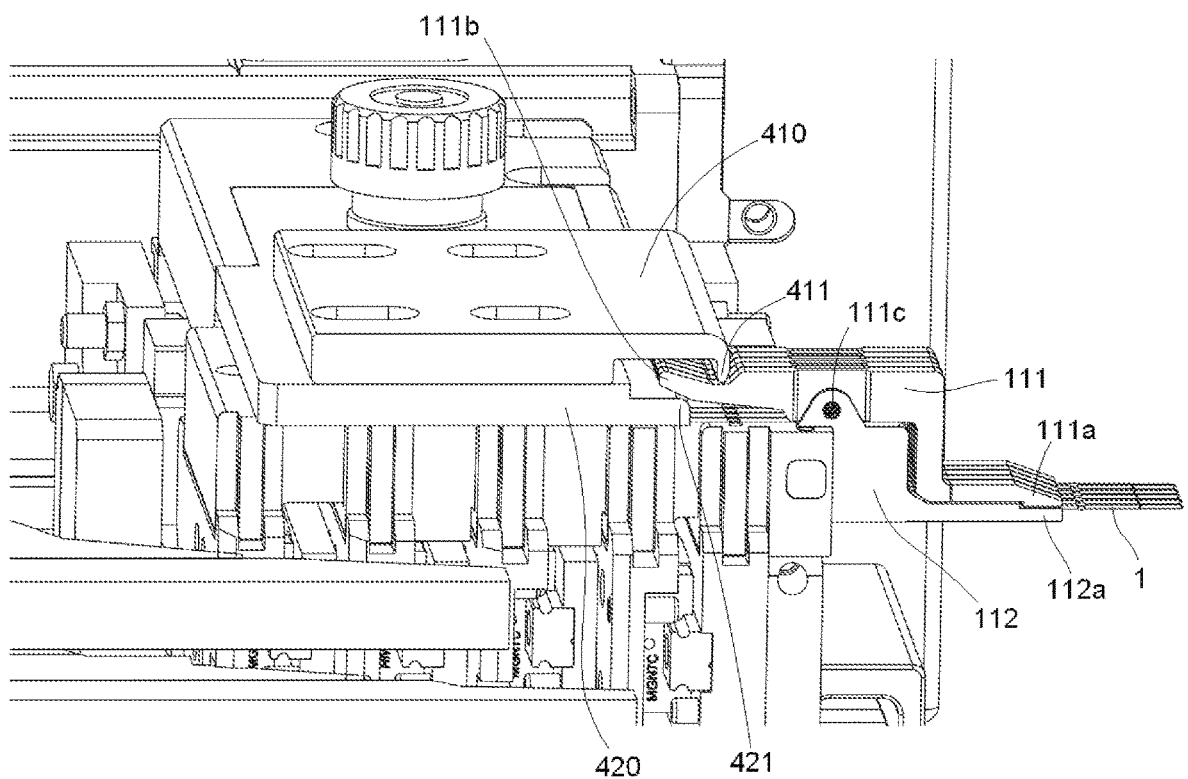
FIG. 6 is a perspective view of an opening and closing control device of the gripping system.

The gripping system, as shown in FIGS. 1 and 6, comprises an opening and closing control device 400, 500 adapted to control the row of grippers 110 to open or close. The opening and closing control device 400, 500 is adapted to open or close the gripper 110 by pressing downwards or pushing upwards the upper gripping portion 111 to release or grip the contacts 1. The opening and closing control device 400, 500 includes a second pushing mechanism 400 and a second drive mechanism 500. The second pushing mechanism 400 is movably attached on the base 10 of the gripping system. The second drive mechanism 500 is adapted to drive the second pushing mechanism 400 to move in the second direction Y.

As shown in FIGS. 5 and 6, when the second drive mechanism 500 drives the second pushing mechanism 400 to move backwards (toward a left side in FIG. 6) in the second direction Y, the second pushing mechanism 400 presses a rear end 111b of the upper gripping portion 111 of the gripper 110 downwards such that a front end 111a of the upper gripping portion 111 rotates upwards about the pivoting axis 111c with respect to a front end 112a of the lower gripping portion 112 and then the row of grippers 110 may be opened. When the row of grippers 110 is opened, the row of contacts 1 may be placed into the row of grippers 110.

As shown in FIGS. 5 and 6, when the second drive mechanism 500 drives the second pushing mechanism 400 to move forwards (toward a right side in FIG. 6) in the second direction Y, the second pushing mechanism 400 pushes the rear end 111b of the upper gripping portion 111 of the gripper 110 upwards such that the front end 111a of the upper gripping portion 111 rotates downwards about the pivoting axis 111c with respect to the front end 112a of the lower gripping portion 112 and then the row of grippers 110 may be closed. When the row of grippers 110 is closed, the row of contacts 1 may be gripped and held therein.

As shown in FIGS. 5 and 6, the second pushing mechanism 400 has an upper plate 410 and a lower plate 420 assembled together. The upper plate 410 is provided with an upper lip 411, and the lower plate 420 is provided with a lower lip 421. The rear end 111b of the upper gripping portion 111 of the gripper 110 is located between the upper lip 411 and the lower lip 421.

As shown in FIGS. 5 and 6, when the second drive mechanism 500 drives the second pushing mechanism 400 to move backwards in the second direction Y, the upper lip 411 presses the rear end 111b of the upper gripping portion 111 downwards such that the gripper 110 is opened. When the second drive mechanism 500 drives the second pushing mechanism 400 to move forwards in the second direction Y, the lower lip 421 pushes the rear end 111b of the upper gripping portion 111 upwards so that the gripper 110 is closed.

A top tilting surface 1101 and a bottom tilting surface 1102, as shown in FIGS. 5 and 6, are formed on the rear end 111b of the upper gripping portion 111. The upper lip 411 is adapted to press the top tilting surface 1101 of the upper gripping portion 111 downwards and to slide along the top tilting surface 1101. The lower lip 421 is adapted to push the bottom tilting surface 1102 of the upper gripping portion 111 upwards and to slide along the bottom tilting surface 1102.

In various embodiments, the second drive mechanism 500 is a cylinder drive mechanism, a stepping motor drive mechanism, or a servo motor drive mechanism.

It should be appreciated for those skilled in this art that the above embodiments are all exemplary embodiments, and many modifications may be made to the above embodiments by those skilled in this art, and various features described in different embodiments may be freely combined with each other without conflicting in configuration or principle.

Although the present disclosure has been described with reference to the attached drawings, the embodiments disclosed in the attached drawings are intended to describe the embodiments of the present disclosure exemplarily, but should not be construed as a limitation to the present disclosure.

Although several embodiments of the general concept of the present disclosure have been shown and described, it would be appreciated by those skilled in the art that various changes or modifications may be made in these embodiments without departing from the principles and spirit of the disclosure, the scope of which is defined in the claims and their equivalents.

What is claimed is:

1. A gripping system, comprising:
a gripping device having a row of grippers arranged in a first direction and adapted to grip a row of contacts and a support frame on which at least two adjacent grippers of the row of grippers are slidably attached;
a base on which the gripping device is removably attached, the base has a projection fitted to a groove formed on the support frame;
a row of gripper supports arranged in a second direction perpendicular to the first direction, the row of grippers are attached on the row of gripper supports, each gripper support of the row of gripper supports other than an outermost gripper support of the row of gripper supports is slidably attached on the support frame; and
a pitch adjustment device adapted to drive the at least two adjacent grippers to slide in the first direction to adjust a pitch between the two adjacent grippers, the pitch adjustment device includes a first pushing mechanism slidably attached on the base and adapted to push each gripper support of the row of gripper supports other than the outermost gripper support to slide in the first direction and a first drive mechanism attached on the base and adapted to drive the first pushing mechanism to slide in the second direction, the first pushing mechanism includes a bracket slidably attached on the base and a plurality of drive blocks attached on the bracket, the first drive mechanism is adapted to drive the bracket to slide in the second direction and drive the plurality of drive blocks to move in the second direction.

2. The gripping system of claim 1, wherein each gripper of the row of grippers other than an outmost gripper of the row of grippers is slidably attached on the support frame, and the outmost gripper is fixedly attached on the support frame.

3. The gripping system of claim 1, wherein the gripping device has a row of sliding rails attached on the support frame, each gripper support other than the outermost gripper support is slidingly attached on a sliding rail of the row of sliding rails and the outermost gripper support is fixedly attached on the support frame.

4. The gripping system of claim 3, further comprising a row of mounting plates attached on the support frame, the row of sliding rails are attached on the row of mounting plates.

5. The gripping system of claim 1, wherein each of the drive blocks of the plurality of drive blocks has a plurality of first tilting surfaces and a second tilting surface cooperating with the first tilting surfaces is formed on each gripper support, the first tilting surfaces are adapted to push against the second tilting surface and slide relative to the second tilting surface.

6. The gripping system of claim 1, wherein the bracket includes a beam slidably attached on the base and a frame attached on the beam, the plurality of drive blocks are removably attached on the frame.

7. The gripping system of claim 6, wherein the first pushing mechanism includes a slider on which the beam is attached and a guiding rail attached on the base, the slider is slidably attached on the guiding rail such that the bracket is slidable along the guiding rail.

8. The gripping system of claim 1, further comprising an opening and closing control device adapted to control the row of grippers to open or close.

9. The gripping system of claim 8, wherein each gripper of the row of grippers has a lower gripping portion and an upper gripping portion pivotally attached on the lower gripping portion, the opening and closing control device is adapted to open or close the gripper by pressing downwards or pushing upwards the upper gripping portion.

10. The gripping system of claim 9, wherein the opening and closing control device has a second pushing mechanism movably attached on the base and a second drive mechanism adapted to drive the second pushing mechanism to move in the second direction.

11. The gripping system of claim 10, wherein when the second drive mechanism drives the second pushing mechanism to move backwards in the second direction, the second pushing mechanism presses a rear end of the upper gripping portion of the gripper downwards and opens the gripper, and when the second drive mechanism drives the second pushing mechanism to move forwards in the second direction, the second pushing mechanism pushes the rear end of the upper gripping portion upwards and closes the gripper.

12. The gripping system of claim 11, wherein the second pushing mechanism has an upper plate and a lower plate assembled together, the upper plate has an upper lip and the lower plate has a lower lip, the rear end of the upper gripping portion is disposed between the upper lip and the lower lip.

13. The gripping system of claim 12, wherein when the second drive mechanism drives the second pushing mechanism to move backwards in the second direction, the upper lip presses the rear end of the upper gripping portion downwards and opens the gripper, and when the second drive mechanism drives the second pushing mechanism to move forwards in the second direction, the lower lip pushes the rear end of the upper gripping portion upwards and closes the gripper.

14. The gripping system of claim 13, wherein the rear end of the upper gripping portion has a top tilting surface and a bottom tilting surface, the upper lip is adapted to press against the top tilting surface of the upper gripping portion and to slide along the top tilting surface, the lower lip is adapted to push against the bottom tilting surface and to slide along the bottom tilting surface.

15. A gripping system, comprising:
a gripping device having a row of grippers arranged in a first direction and adapted to grip a row of contacts and a support frame on which at least two adjacent grippers of the row of grippers are slidably attached, each gripper of the row of grippers has a lower gripping portion and an upper gripping portion pivotally attached on the lower gripping portion;
a base on which the gripping device is removably attached, the base has a projection fitted to a groove formed on the support frame;
a row of gripper supports arranged in a second direction perpendicular to the first direction, the row of grippers are attached on the row of gripper supports, each gripper support of the row of gripper supports other than an outermost gripper support of the row of gripper supports is slidably attached on the support frame;

a pitch adjustment device adapted to drive the at least two adjacent grippers to slide in the first direction to adjust a pitch between the two adjacent grippers, the pitch adjustment device includes a first pushing mechanism slidably attached on the base and adapted to push each gripper support of the row of gripper supports other than the outermost gripper support to slide in the first direction and a first drive mechanism attached on the base and adapted to drive the first pushing mechanism to slide in the second direction; and an opening and closing control device adapted to control the row of grippers to open or close, the opening and closing control device is adapted to open or close the gripper by pressing downwards or pushing upwards the upper gripping portion, the opening and closing control device has a second pushing mechanism movably attached on the base and a second drive mechanism adapted to drive the second pushing mechanism to move in the second direction, when the second drive mechanism drives the second pushing mechanism to move backwards in the second direction, the second pushing mechanism presses a rear end of the upper gripping portion of the gripper downwards and opens the gripper, and when the second drive mechanism drives the second pushing mechanism to move forwards in the second direction, the second pushing mechanism pushes the rear end of the upper gripping portion upwards and closes the gripper.

16. The gripping system of claim 15, wherein the second pushing mechanism has an upper plate and a lower plate assembled together, the upper plate has an upper lip and the lower plate has a lower lip, the rear end of the upper gripping portion is disposed between the upper lip and the lower lip.

17. The gripping system of claim 16, wherein when the second drive mechanism drives the second pushing mechanism to move backwards in the second direction, the upper lip presses the rear end of the upper gripping portion downwards and opens the gripper, and when the second drive mechanism drives the second pushing mechanism to move forwards in the second direction, the lower lip pushes the rear end of the upper gripping portion upwards and closes the gripper.

18. The gripping system of claim 17, wherein the rear end of the upper gripping portion has a top tilting surface and a bottom tilting surface, the upper lip is adapted to press against the top tilting surface of the upper gripping portion and to slide along the top tilting surface, the lower lip is adapted to push against the bottom tilting surface and to slide along the bottom tilting surface.

* * * * *